(12) United States Patent
Van Bruggen et al.

(10) Patent No.: US 7,830,495 B2
(45) Date of Patent: Nov. 9, 2010

(54) LITHOGRAPHIC APPARATUS AND POSITION SENSOR

(75) Inventors: Olaf Hubertus Wilhelmus Van Bruggen, Schijndel (NL); Marcel Koenraad Marie Baggen, Nuenen (NL); Johannes Roland Dassel, Best (NL); Remko Wakker, Eindhoven (NL); Stoyan Nihtianov, Eindhoven (NL); Frank Auer, Valkenswaard (NL); Frits Van Der Meulen, Eindhoven (NL); Patrick David Vogelsang, Eindhoven (NL); Martinus Cornelis Reijnen, Tilburg (NL); Tom Van Zutphen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 487 days.

(21) Appl. No.: 11/822,867

(22) Filed: Jul. 10, 2007

(65) Prior Publication Data

US 2009/0015246 A1  Jan. 15, 2009

(51) Int. Cl.
*G03B 27/42* (2006.01)
*G01B 7/14* (2006.01)

(52) U.S. Cl. .................................. 355/53; 324/207.22

(58) Field of Classification Search ............. 324/207.22
See application file for complete search history.

(56) References Cited

U.S. PATENT DOCUMENTS

| | | | |
|---|---|---|---|
| 5,493,216 A | * | 2/1996 | Asa .......................... 324/207.2 |
| 2005/0077786 A1 | * | 4/2005 | De Weerdt .................... 310/12 |
| 2006/0208726 A1 | * | 9/2006 | Mock et al. ............. 324/207.24 |

* cited by examiner

*Primary Examiner*—Edward J Glick
*Assistant Examiner*—Deoram Persaud
(74) *Attorney, Agent, or Firm*—Sterne, Kessler, Goldstein & Fox P.L.L.C.

(57) ABSTRACT

A lithographic apparatus having a stationary magnet motor to drive a support such as a substrate support or a patterning device support, may be provided with a measurement system to measure a position of the support in question, e.g., to provide a safety system to prevent a collision of the support with another part. The measurement system may be configured to measure a magnetic field strength of an alternating magnetic field generated by the magnet assembly of the stationary magnet motor, and/or measure generation of eddy currents in a metallic layer shielding the magnet assembly in combination with an inductance measurement of an electromagnet generating the alternating magnetic field causing the eddy currents, and/or measure light using an optical position sensitive sensor such as a CCD metric or linear photodiode positioned in a light plane emitted by an emitter.

9 Claims, 3 Drawing Sheets

LITHOGRAPHIC APPARATUS AND POSITION SENSOR

FIELD

The present invention relates a lithographic apparatus comprising a position sensor, and to a stage system comprising such a position sensor.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Presently in lithography, use may be made of a stationary magnet (i.e. moving coil) motor to drive a support, e.g. a substrate support or a patterning device support. When making use of a stationary magnet motor, a stationary magnetic field is generated. Due to the high demands on throughput and processing speed of the lithographic apparatus, a high power motor is required, which translates into a strong magnet hence resulting in a high magnetic field strength.

In a lithographic apparatus, a position of the support (e.g., substrate support) may be measured making use of an optical measurement device, such as an encoder and/or an interferometer. Making use of such an optical measurement device, a position of the support in question can be measured with respect to a reference, such as a metrology frame of the lithographic apparatus or a projection system thereof.

SUMMARY

An interferometer or encoder used to measure a position of the substrate support or patterning device support may however not be fully suitable for position measurements in all situations. As an example, these position sensors may not be ideally suited for safety purposes, e.g. to prevent a collision between the support in question and another part of the lithographic apparatus, e.g. the projection system, the stationary magnet, etc., due to the complex measurement and control processes which lead to relatively long processing times in corresponding control systems. Also, a need may be present to provide a position measurement outside a position measurement range of the interferometer or encoder as mentioned above, for example when swapping positions of a plurality of supports, etc.

It is desirable, for example, to provide a (further) position measurement of the support.

According to an embodiment of the invention, there is provided a lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate support constructed to hold a substrate;
a projection system configured to project the patterned radiation beam onto a target portion of the substrate;
a motor comprising a stationary magnet assembly having a two dimensional arrangement of alternately polarized magnets to generate a spatially alternately polarized magnetic field, the motor configured to drive the patterning device support or the substrate support; and
a position sensor configured to measure a position of the patterning device support or the substrate support, the position sensor comprising a magnetic field sensor to measure a field strength of the magnetic field, and a sensor processing device to determine a position from the magnetic field strength as measured by the magnetic field sensor.

According to an embodiment of the invention, there is provided a stage system, comprising a support; a motor to drive the support, the motor comprising a stationary magnet assembly having a two dimensional arrangement of alternately polarized magnets to generate a spatially alternately polarized magnetic field; and a position sensor to measure a position of the support, the position sensor comprising a magnetic field sensor to measure a field strength of the magnetic field, and a sensor processing device to determine a position from the field strength as measured by the magnetic field sensor.

According to a further embodiment of the invention, there is provided a lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate support constructed to hold a substrate;
a projection system configured to project the patterned radiation beam onto a target portion of the substrate;
a motor comprising a stationary magnet assembly and a metallic layer to cover the magnet assembly, the motor configured to drive the patterning device support or the substrate support; and
a position sensor to measure a position of the patterning device support or the substrate support in a direction substantially perpendicular to a plane formed by the metallic layer, the position sensor comprising an electromagnet, a drive circuit to drive the electromagnet to generate an alternating magnetic field, a measuring circuit to measure an electrical impedance parameter of the electromagnet and a sensor processing device to derive a position of the patterning device support or the substrate support from an effect on the electrical impedance parameter, the effect caused by eddy currents generated in the metallic layer by the alternating magnetic field.

According to an embodiment of the invention, there is provided a stage system, comprising: a support; a motor to drive the support, the motor comprising a stationary magnet assembly and a metallic layer to cover the magnet assembly; and a position sensor to measure a position of the support in a direction substantially perpendicular to a plane formed by the metallic layer, the position sensor comprising an electromagnet, a drive circuit to drive the electromagnet to generate an alternating magnetic field, a measuring circuit to measure an electrical impedance parameter of the electromagnet, and a sensor processing device to derive a position of the support from an effect on the electrical impedance parameter, the effect caused by eddy currents generated in the metallic layer by the alternating magnetic field.

According to an embodiment of the invention, there is provided a lithographic apparatus comprising:

an illumination system configured to condition a radiation beam;

a patterning device support constructed to support a patterning device, the patterning device being capable of imparting the radiation beam with a pattern in its cross-section to form a patterned radiation beam;

a substrate support constructed to hold a substrate;

a projection system configured to project the patterned radiation beam onto a target portion of the substrate, a motor comprising a stationary magnet assembly, the motor configured to drive the patterning device support or the substrate support; and a position sensor to measure a position of the patterning device support or the substrate support, the position sensor comprising an emitter to emit a light plane, and a detector to detect a position of incidence of light from the light plane on the detector along a direction substantially perpendicular to the plane.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3b depicts a highly schematic view of a position sensor of the lithographic apparatus according to FIG. 3a.

DETAILED DESCRIPTION

Figure 1:
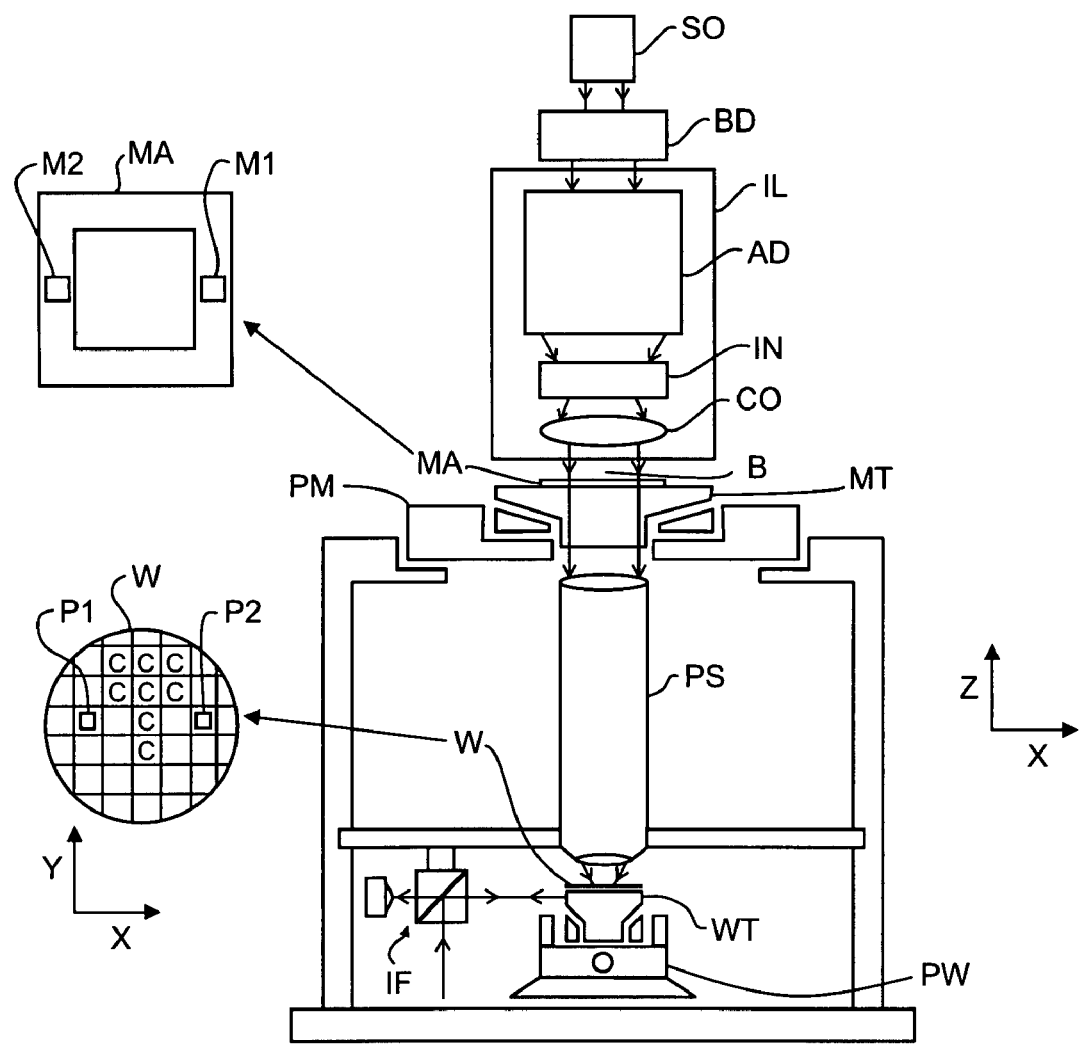
FIG. 1 depicts a lithographic apparatus in which the invention may be embodied.

FIG. 1 schematically depicts a lithographic apparatus according to an embodiment of the invention. The apparatus includes an illumination system (illuminator) IL configured to condition a radiation beam B (e.g. UV radiation or any other suitable radiation), a patterning device support (e.g. a mask table) MT constructed to support a patterning device (e.g. a mask) MA and connected to a first positioning device PM configured to accurately position the patterning device in accordance with certain parameters. The apparatus also includes a substrate support (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a metric arrangement of small mirrors, each of which can be individually tilted so as to reflect an incoming radiation beam in different directions. The tilted mirrors impart a pattern in a radiation beam which is reflected by the mirror metric.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate supports (and/or two or more patterning device supports). In such "multiple stage" machines, the additional supports may be used in parallel, or preparatory steps may be carried out on one or more supports while one or more other supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometer device, linear or other encoder or capacitive sensor), the substrate support WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support MT may be realized with the aid of a long-stroke module (coarse positioning) and a short-stroke module (fine positioning), which form part of the first positioning device PM. Similarly, movement of the substrate support WT may be realized using a long-stroke module and a short-stroke module, which form part of the second positioner PW. In the case of a stepper (as opposed to a scanner) the patterning device support MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support MT and the substrate support WT are kept essentially stationary, while an entire pattern imparted to the radiation beam is projected onto a target portion C at one time (i.e. a single static exposure). The substrate support WT is then shifted in the X and/or Y direction so that a different target portion C can be exposed. In step mode, the maximum size of the exposure field limits the size of the target portion C imaged in a single static exposure.

2. In scan mode, the patterning device support MT and the substrate support WT are scanned synchronously while a pattern imparted to the radiation beam is projected onto a target portion C (i.e. a single dynamic exposure). The velocity and direction of the substrate support WT relative to the patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support MT is kept essentially stationary holding a programmable patterning device, and the substrate support WT is moved or scanned while a pattern imparted to the radiation beam is projected onto a target portion C. In this mode, generally a pulsed radiation source is employed and the programmable patterning device is updated as required after each movement of the substrate support WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
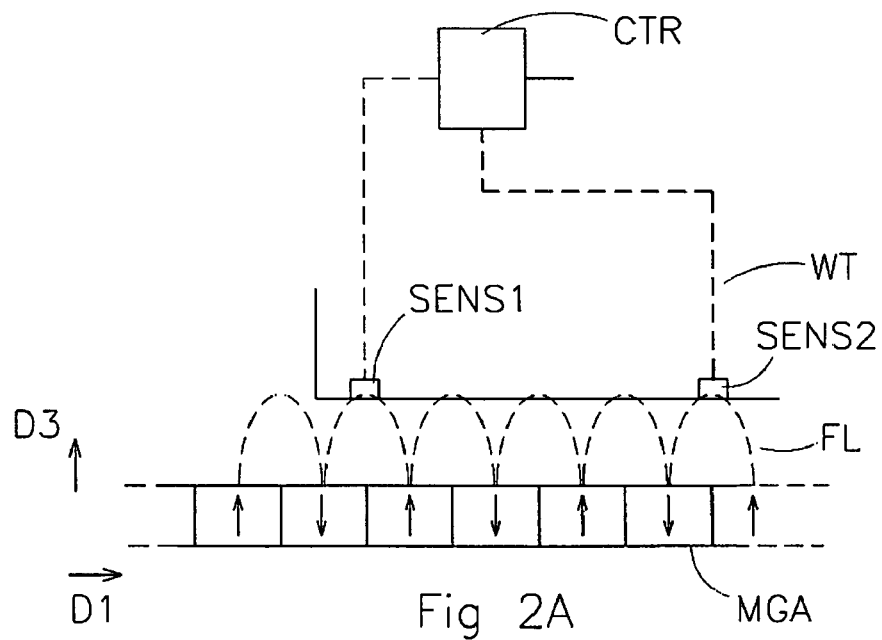
FIGS. 2a and 2b show a highly schematic view of a part of a lithographic apparatus according to an embodiment of the invention.
Figure 2B:
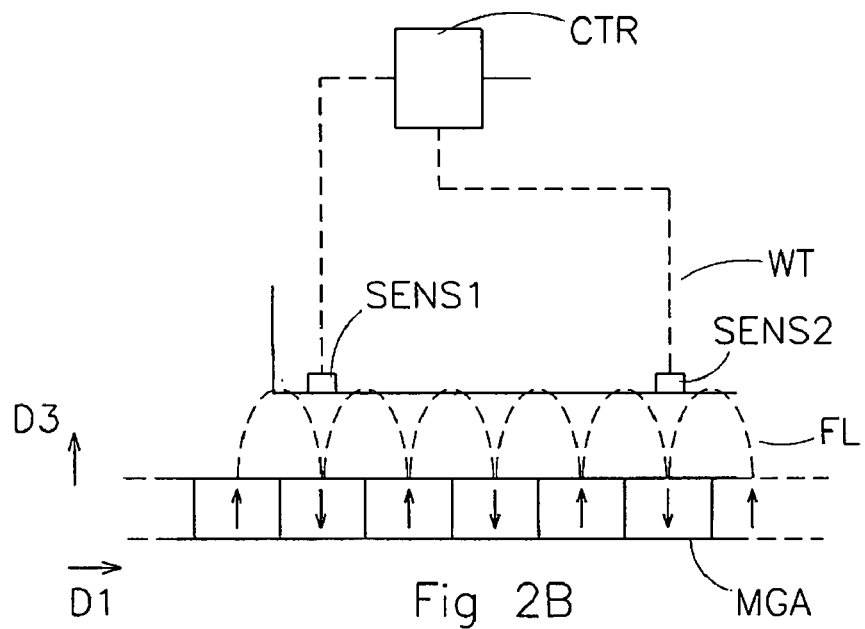

FIGS. 2a and 2b each depict a part of a substrate support WT of a stage system of a lithographic apparatus, such as the lithographic apparatus depicted in and described with reference to FIG. 1. The substrate support WT is driven by a motor comprising a stationary magnet assembly MGA generating a magnetic field. The motor further comprises one or more coils (not shown in FIGS. 2a and 2b) to interact with the magnetic field generated by the stationary magnet assembly. The coil(s) may be connected to the substrate support WT. It is to be understood that in this example, a substrate support WT is shown. The ideas presented here, however, may be applied to any other support or structure as well, such as a patterning device support of a lithographic apparatus or a component used to move a substrate or patterning device support. In the embodiment depicted here, the magnet assembly MGA comprises an arrangement of alternately polarized magnets. In this example, the magnets are alternately polarized upwards or downwards, i.e. alternately polarized in the direction following the arrow D3 or in opposite direction of the arrow D3 (also, magnets in a Halbach configuration may be applied). Thus, an alternately polarized magnetic field is generated as indicated by field lines FL. In FIGS. 2a and 2b, a one dimensional arrangement of alternately polarized magnets has been depicted. In a practical embodiment, however, use may be made of a two dimensional arrangement in direction D1 and a direction D2 (not shown) perpendicular to the plane of drawing. By such a two dimensional arrangement, a desired range of movement in the plane formed by D1 and D2 may be provided. Due to the alternately polarized magnets, a magnetic field is generated which is specially alternately polarized along the direction D1 (as well as possibly the direction D2).

Figure 2C:
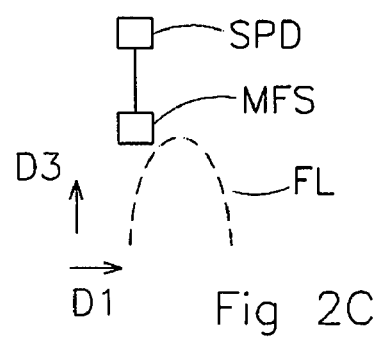
FIG. 2c shows a highly schematic view of a position sensor of the lithographic apparatus according to FIGS. 2a and 2b.

A sensor SENS1 is provided to measure a position of the substrate support WT, more particularly a long stroke (coarse) position by a long stroke actuator thereof. Thus, the sensor may measure the position of the substrate support WT only indirectly. In FIG. 2a, a position of the substrate support WT with respect to the magnet assembly MGA is shown, where the sensor SENS1 is positioned in a part of the magnetic field where the field is substantially horizontally oriented (i.e. oriented along a direction in the plane formed by D1 and D2). The horizontal orientation can easily be understood from the fact that the field line FL in the position shown in FIG. 2a is, at the sensor SENS1, substantially horizontal, i.e. in this example substantially parallel to the direction D1. In FIG. 2b, the substrate support WT has been moved towards the left in the plane of drawing and thus the sensor SENS1, in this example, is at a position where a low magnetic field strength is present. Also, at this position, a direction of the magnetic field strength differs from the substantially horizontal direction in the case of FIG. 2a. Thus, as will be understood from the examples shown in FIGS. 2a and 2b, upon movement of the substrate support WT with respect to the stationary magnet assembly MGA, the sensor SENS1 will be subjected to different magnetic field strengths and different orientations of the magnetic field due to the spatially alternately polarized magnetic field. As depicted in more detail in FIG. 2c, the sensor SENS1 may comprise a magnetic field sensor MFS to measure a field strength of the magnetic field, and a sensor processing device SPD to determine a position information from the field strength as measured by the magnetic field sensor MFS. Thus, use may be made of the presence of the magnetic field to derive position information therefrom. Instead of having the high magnetic field strength of the stationary magnet assembly disturbing an accuracy of the position measurement, use may be made of that magnetic field to derive position information of the sensor and hence position information of the substrate support WT therefrom.

Due to the alternating polarization of the magnets of the magnet assembly MGA, a magnetic field is created which spatially changes in intensity as well as in direction thereof. Position information can therefore be obtained from direction, directional components and/or intensity of the magnetic field as detected by the sensor SENS1. Firstly, use can be made of a periodicity of the measured magnetic field. When moving the substrate support WT along the direction D1, each time a following magnet of the magnet assembly is passed by the sensor SENS1, the magnetic field will show a change leading to a repetitive pattern. Position information may be derived therefrom by the sensor processing device SPD, e.g., counting repetitions of the magnetic pattern. For such periodicity measurement, use may be made of a measurement of the magnetic field strength in any direction, e.g. direction D1, D2 or D3.

Secondly, position information can be derived by the sensor processing device SPD from a quadrature measurement on the measured magnetic field in a main plane of movement of the substrate support WT, i.e. in the plane formed by the directions D1 and D2. In fact, when moving the substrate support WT from the position shown in FIG. 2a to the position shown in FIG. 2b, a change of the field as measured by the sensor SENS1 in the direction D1 will be observed. The field strength in this direction will be reduced. Likewise, the magnet assembly MGA will show an alternating polarization of the magnets in the direction D2, therefore a movement of the substrate support WT in the direction D2 will also result in a change in the magnetic field, in particular in the direction D2. By measuring a ratio between the field in the directions D1 and D2, position information can be obtained as to the position of the substrate support WT in the plane defined by directions D1 and D2, which will of course show the above periodicity for large movement of the substrate support WT in either direction D1 or D2. By combining the periodic position information and the quadrature or ratio metric position information, the course position information from the periodicity measurements can be combined with the fine position information from the ratio metric or quadrature measurement to provide an accurate position measurement having a large measurement range. By making use of quadrature or ratio metric measurements in directions D1, D2, an effect of a vertical displacement of the substrate support WT, i.e., a displacement in direction D3, can substantially be taken out of the measurement result of the position measurements in the plane defined by D1 and D2.

The sensor processing device may comprise any processing device, such as a micro processor, micro computer, etc., and may be formed by a separate processing device, however may also be formed by a suitable software module to be executed by a processing device having other functions also.

In addition to the measurements of the field strength as described above, a position may also be determined in the direction perpendicular to the plane formed by D1 and D2 as a displacement of the substrate support WT in the direction D3 will also result in a change in the magnetic field as measured by the sensor SENS1. To be able to cope with the interrelations between the field strength changes when displacing the substrate support in any direction, the sensor processing device may be configured to derive the position in the direction D3 by relating the measured field strength to a reference field strength corresponding to a reference position in the direction D3. The reference field strength may however depend on the position in the plane defined by D1 and D2 due to the nature of the magnetic field generated in this embodiment. Thus, the reference field strength may be determined based on the measured position in the plane (either by the sensor SENS1 or by any other measurement system) or based on the field strength measured in the two directions D1, D2 in the plane.

The measurement of the position as disclosed herein may be applied for many purposes. For example, a control device of the lithographic apparatus may be configured to drive the motor to correct a position of the substrate support WT when the position as measured by the position sensor is outside a certain operating position range, e.g., outside a safe operating range. Thus, collision of the substrate support WT with another part may be prevented. As described above, a single sensor SENS1 has been disclosed. In an implementation, use may be made of a plurality of such sensors, e.g. 3 position sensors arranged in the plane of the magnet assembly MGA (the plane defined by D1 and D2) to determine a position in a vertical direction (a position in direction D3) and/or a tilt with respect to the plane (e.g., with respect to D1 or D2).

The measurement system described above may not only be applied in a lithographic apparatus, but may be applied in any stage system. For illustrative purposes, a second sensor, i.e. sensor SENS2 has been depicted in FIGS. 2a and 2b also. The sensor SENS1, SENS2 may be connected to a control device CTR of the lithographic apparatus.

FIGS. 3a and 3b again show a magnet assembly MGA. The magnet assembly MGA may be similar in type and construction to that shown in FIGS. 2a and b, e.g. comprising a two dimensional planar arrangement of alternately polarized magnets, but may be of any other type and construction. The magnet assembly forms part of a motor and provides a stationary magnet thereof. A coil of the motor (not shown) may be provided on or in the substrate support WT, which has been indicated in FIG. 3a partially and highly schematically. A metallic layer ML is provided to cover the magnet assembly MGA, e.g. to provide a physical protection thereto. A position sensor SENS2a is provided which may measure a position of the substrate support WT, more particularly a long stroke (coarse) position by a long stroke actuator thereof. Thus, the sensor may measure the position of the substrate support WT only indirectly.

Figure 3A:
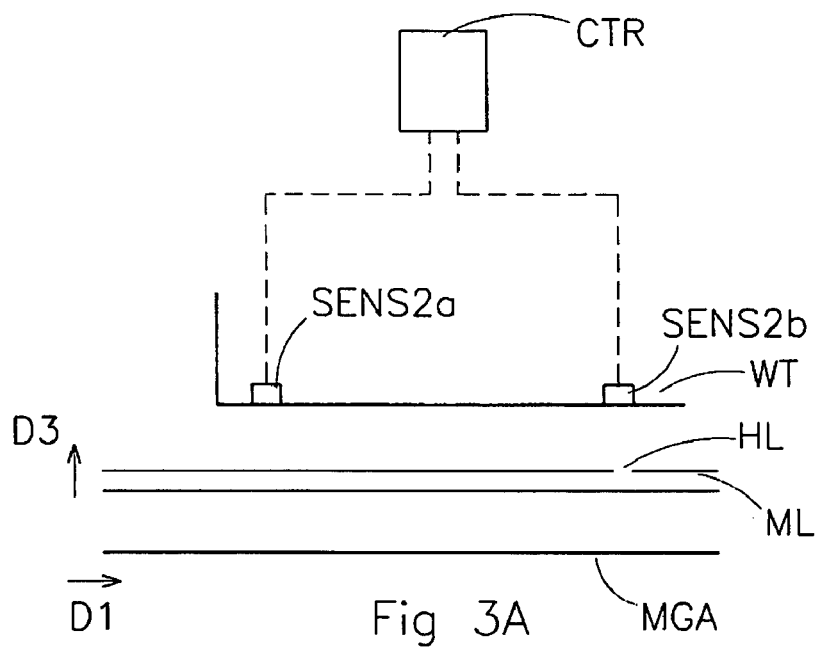
FIG. 3a depicts a highly schematic view of a part of a lithographic apparatus according to an embodiment of the invention.
Figure 3B:
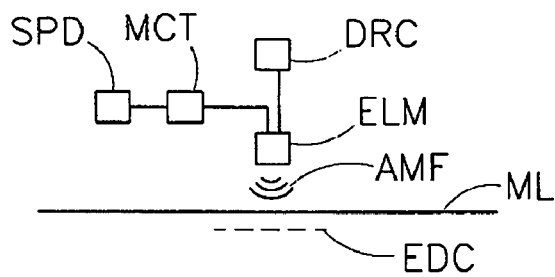

The position sensor SENS2a, a block schematic view thereof being depicted in FIG. 3b, comprises an electric coil ELM of an electromagnet and a drive circuit DRC to drive the electric coil to generate an alternating magnetic field AMF, i.e. a magnetic field which alternates in time. A measuring circuit MCT is provided to measure an electrical impedance parameter of the electromagnet, e.g. an inductance thereof. By the alternating magnetic field, eddy currents EDC are generated in the metallic layer ML dependent on the strength of the alternating magnetic field AMF. The closer the electric coil ELM is to the metallic layer ML, the higher the strength of the alternating magnetic field AMF in the metallic layer will be, the higher the intensity of the eddy currents will be. The eddy currents translate into a change of the impedance parameter, e.g. the inductance of the electromagnet, which may in turn be detected by the impedance measuring circuit MCT, which may, for example, measure a current through a coil of the electric coil ELM, a ratio of a voltage over and current through the coil of the electric coil ELM, a magnitude of a drive current of the drive circuit driving the electromagnet, or any other suitable parameter. A position of the substrate support WT may thus be determined in the direction D3 by, e.g., a sensor processing device SPD of the sensor, the sensor processing device (which may, e.g., comprise a controller, microprocessor, or any other processing device or which may be comprised in a controller or microprocessor having other functions and be formed by a suitable software module therein) to determine the position of the substrate support from the impedance parameter as measured by the measurement circuit MCT. Thus, the metallic layer provides a substrate for the eddy currents, while shielding the alternating magnet structure underneath.

Also, by an appropriate selection of the layer, independence of the position dependent magnetic field from the permanent magnet array is provided. The metallic layer may comprise a magnetically conductive layer having a high relative magnetic permeability and a low resistivity. As an example, the metallic layer may comprise stainless steel, aluminum, copper, and/or silver. Furthermore, the layer may provide a ruggedized and corrosion resistant layer, which may be advantageous in case of e.g. immersion lithography where a humid environment may be provided due to the presence of the immersion liquid.

A frequency of the alternating magnetic field may be in the order of magnitude of 100 kilohertz or larger, desirably 1 megahertz or larger. For an eddy current sensor, a higher actuator frequency implies less penetration depth, and consequently, the higher the frequency, the thinner the metallic layer may be, which may result in a higher efficiency of the stationary magnet motor. On the other hand, the frequency cannot be arbitrarily increased, as such an increase will result in an increased sensitivity to parasitic capacitance, sensitivity to liquid (e.g., water) particles or film, etc.

To be able to prevent effects of the high magnetic field by the magnet assembly MGA on the sensor SENS2a, the electric coil ELM and possibly other parts of the position sensor and/or the metallic layer are desirably free from materials exhibiting a magnetic saturation.

To not only obtain height information, i.e. information of the position in the direction D3, but also a tilt of the substrate support WT, a plurality of position sensors are provided, a processing device of the lithographic apparatus (e.g. control device CTR) configured to derive a tilt of the substrate support WT from the position measurements of the plurality of position sensors, e.g. from the differences between the position measurements as measured by the position sensors. In FIG. 3a, as an example, a second position sensor SENS2b has been depicted of the plurality of position sensors. A sensor output signal from the position sensors SENS2a and SENS2b is provided to the control device CTR. By making use of three or more position sensors arranged in a main plane of movement of the substrate stage, i.e. a plane defined by D1 and D2 (D2 (not shown) being perpendicular to the plane of drawing of FIG. 3a), a tilt of the substrate support WT with respect to the main plane of movement (e.g., about D1 or about D2) can be determined.

By having multiple position sensors, it is also possible to obtain position information in case that, e.g., one of those sensors is above a hole HL in the metallic layer. In that case, a generation of eddy currents EDC in the metallic layer will be affected by the hole, leading to a change in the read out of the impedance parameter of the electric coil of that sensor, thereby affecting a read out of the sensor in question. The sensor in question may then be deselected when the substrate support WT is in a position where the sensor in question is above such hole, which may be performed in any number of ways such as the processing device SPD or control device CTR configured to detect a read out of the sensor being outside a certain sensor output signal arrange, and then to deselect the sensor accordingly.

The position sensing as described herein may be used for many applications, e.g. a safety system wherein the control device is configured to drive the motor to correct a position of the substrate support WT when the measured position is outside a certain operating position range, e.g. a safe operating range.

Two or more position sensors may be provided and a height of the substrate support (i.e. a position in direction D3) and a tilt thereof with respect to the plane of the magnet assembly, i.e. the main plane of movement of the substrate support WT, may be determined.

The measurement system described in FIGS. 3a and 3b may not only be applied in a lithographic apparatus, but may be applied in any stage system.

Using the measurement system as described with reference to FIGS. 3a and 3b, a measurement of a position may be provided using a relatively low strength magnetic field in an environment comprising a high strength magnetic field from the stationary magnet assembly of the substrate support motor, which is commonly considered illogical or counterintuitive. The frequency of the alternating magnetic field AMF significantly differs from the stationary magnetic field from the magnet assembly MGA, thus allowing for use of a low strength magnetic field for position measurement in a high strength magnetic field environment.

Figure 4:
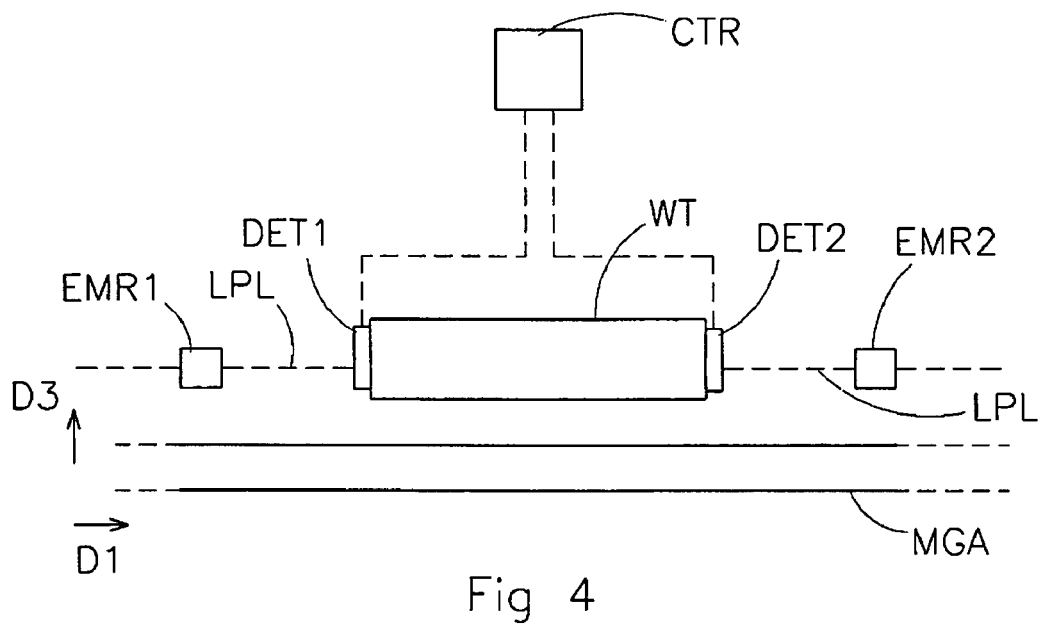
FIG. 4 depicts a highly schematic view of a part of a lithographic apparatus according to an embodiment of the invention.

FIG. 4 shows a highly schematic representation of a substrate support WT and a magnet assembly MGA to drive the substrate support WT. The magnet assembly MGA may interact with coils (not shown) which may be connected to the substrate support WT to form the motor. A position of the substrate support WT may be measured by a position sensor, the position sensor comprising an emitter EMR1 to emit a light plane LPL and a detector DET1 to detect a position of incidence of light from the light plane on the detector along the direction D3, i.e. along a direction substantially perpendicular to a main plane of movement of the substrate support WT, the main plane of movement substantially coinciding with a plane of the magnet assembly MGA, i.e. a plane formed by directions D1 and D2 (D2 (not shown) being perpendicular to a plane of drawing of FIG. 4). As the light plane LPL is substantially parallel to the main plane of movement of the substrate support WT, a read out by the detector DET1 will hardly or not be affected by a displacement of the substrate support WT along its main plane of movement. The detector DET1 may be formed by a matrix of photo detectors, e.g. a CCD matrix, a linear position sensitive device or any other position sensitive photo detecting device. The light plane may be formed by a laser and a rotatable mirror or in any other suitable way (e.g. by combining a light source with a suitable stationary optical element to shape the light of the light source into a plane). As depicted in FIG. 4, two light sources EMR1, EMR2 are provided. In a practical embodiment, more than two light sources may be applied. Thus, detectors may be provided at opposite sides of the substrate support WT, such as in this example the detectors DET1 and DET2 to enable a control device CTR of the lithographic apparatus to determine a height of the substrate support WT as well as a tilt thereof with respect to the main plane of movement (e.g., about direction D1 or direction D2). To determine a tilt with respect to the plane, use of 3 or more detectors arranged along the plane, is desired.

The measurement system described here may be applied for many purposes, such as a safety system wherein a control device of the lithographic apparatus, such as control device CTR, is configured to drive the motor to correct a position of the substrate support WT when outside a certain position arrange, e.g. a certain safe operating range of the substrate support WT. Thus, a collision of the substrate support WT with, e.g., the magnet assembly MGA or any other part of the lithographic apparatus may be prevented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams. The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
   an illumination system configured to condition a radiation beam;
   a patterning device support constructed to support a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate;
   a motor comprising a stationary magnet assembly having a two dimensional arrangement of alternately polarized magnets to generate a spatially alternately polarized magnetic field, the motor configured to drive the patterning device support or the substrate support; and
   a position sensor configured to measure a position of the patterning device support or the substrate support, the position sensor comprising a magnetic field sensor configured to perform a quadrature measurement of a field strength of the magnetic field in a plane, and a sensor processing device configured to determine the position from the quadrature measurement.

2. The lithographic apparatus of claim 1, wherein the sensor processing device is configured to derive the position from a periodicity of the measured magnetic field.

3. The lithographic apparatus of claim 1, wherein the sensor processing device is configured to determine the position by combining results of the quadrature measurement with a derived periodicity of the measured magnetic field.

4. The lithographic apparatus of claim 1, wherein the sensor processing device is configured to determine a position in a direction perpendicular to the plane comprising the two dimensions from an output of the magnetic field sensor.

5. The lithographic apparatus of claim 4, wherein the sensor processing device is configured to derive the position in the direction perpendicular to the plane by relating the measured field strength to a reference field strength corresponding to a reference position in the direction perpendicular to the plane.

6. The lithographic apparatus of claim 5, wherein the reference field strength is determined in dependency of the measured position in the plane or in dependency of the field strength measured in the plane.

7. The lithographic apparatus of claim 1, wherein a control device of the lithographic apparatus is configured to drive the motor to correct a position of the patterning device support or the substrate support when the position as measured by the position sensor is outside a certain operating position range.

8. The lithographic apparatus of claim 7, wherein the sensor processing device is configured to determine a position in a direction perpendicular to the plane comprising the two dimensions from an output of the magnetic field sensor, and comprising a plurality of position sensors, the control device configured to determine, from positions provided by the plurality of position sensors, an effective position of the patterning device support or the substrate support in a direction perpendicular to the plane and a tilt of the patterning device support or the substrate support with respect to the plane.

9. A stage system, comprising:
a support;
a motor configured to drive the support, the motor comprising a stationary magnet assembly having a two dimensional arrangement of alternately polarized magnets to generate a spatially alternately polarized magnetic field; and
a position sensor configured to measure a position of the support, the position sensor comprising a magnetic field sensor configured to perform a quadrature measurement of a field strength of the magnetic field, and a sensor processing device configured to determine the position from the quadrature measurement.

* * * * *